United States Patent
Son et al.

(10) Patent No.: US 9,893,367 B1
(45) Date of Patent: Feb. 13, 2018

(54) CATALYST INTERLAYER FOR THE FUEL ELECTRODE OF THIN ELECTROLYTE SOLID OXIDE CELL AND METHOD OF FORMING THE SAME

(71) Applicant: KOREA INSTITUTE OF SCIENCE AND TECHNOLOGY, Seoul (KR)

(72) Inventors: Ji-Won Son, Seoul (KR); Thieu Cam Anh, Seoul (KR); Jongsup Hong, Seoul (KR); Hyoungchul Kim, Seoul (KR); Kyung Joong Yoon, Seoul (KR); Jong Ho Lee, Seoul (KR); Hae-Weon Lee, Seoul (KR); Byung Kook Kim, Seoul (KR)

(73) Assignees: KOREA INSTITUTE OF SCIENCE AND TECHNOLOGY, Seoul (KR); GLOBAL FRONTIER CENTER FOR MULTISCALE ENERGY SYSTEMS, Seoul (KR)

( * ) Notice: Subject to any disclaimer, the term of this patent is extended or adjusted under 35 U.S.C. 154(b) by 0 days.

(21) Appl. No.: 15/399,066

(22) Filed: Jan. 5, 2017

(30) Foreign Application Priority Data

Oct. 13, 2016 (KR) .................. 10-2016-0132741

(51) Int. Cl.
*B05D 5/12* (2006.01)
*H01M 4/88* (2006.01)
(Continued)

(52) U.S. Cl.
CPC ........... *H01M 4/8871* (2013.01); *C23C 14/28* (2013.01); *C23C 14/34* (2013.01); *H01M 4/92* (2013.01); *H01M 8/1246* (2013.01); *B05D 5/12* (2013.01); *B05D 7/50* (2013.01); *H01M 2008/1293* (2013.01)

(58) Field of Classification Search
USPC ............ 427/115, 586, 596, 97.1; 204/192.1, 204/192.17
See application file for complete search history.

(56) References Cited

U.S. PATENT DOCUMENTS

| 2002/0177031 A1* | 11/2002 | Doshi ............... H01M 4/8605 429/489 |
| 2007/0015045 A1* | 1/2007 | Lee .................... H01M 4/8621 429/489 |

(Continued)

OTHER PUBLICATIONS

Kim et al., In-situ nano-alloying Pd—Ni for economical control of syngasproduction from high-temperature thermo-electrochemical reductionof steam/CO2, Applied Catalysis B: Environmental, Jul. 15, 2016, pp. 265-273, Environmental 200.

(Continued)

*Primary Examiner* — Brian K Talbot
(74) *Attorney, Agent, or Firm* — Goldilocks Zone IP Law

(57) ABSTRACT

Provided is an interlayer for a thin electrolyte solid oxide cell, a thin electrolyte solid oxide cell including the same, and a method of forming the same. In various embodiments, functional elements (a fuel electrode, an electrolyte and a cathode) of the solid oxide cell are formed by means of a thin film process, and thus a nanostructure of the catalyst is not seriously lost due to agglomeration, different from a powder process. Thus, it is possible to accomplish catalyst activation according to a high specific surface area.

5 Claims, 12 Drawing Sheets

Schematic of the Pd mulcilayers in AFL

(51) Int. Cl.
*C23C 14/28* (2006.01)
*H01M 8/1246* (2016.01)
*H01M 4/92* (2006.01)
*C23C 14/34* (2006.01)
*H01M 8/124* (2016.01)
*B05D 7/00* (2006.01)

(56) References Cited

U.S. PATENT DOCUMENTS

| | | | | |
|---|---|---|---|---|
| 2010/0021787 A1* | 1/2010 | Wu | ............... | C23C 14/205 |
| | | | | 429/535 |
| 2010/0028757 A1* | 2/2010 | Fu | ............... | H01M 4/8621 |
| | | | | 429/440 |
| 2012/0003565 A1* | 1/2012 | Son | ............... | H01M 4/861 |
| | | | | 429/496 |
| 2012/0094213 A1* | 4/2012 | Ha | ............... | H01M 8/1246 |
| | | | | 429/495 |
| 2013/0078550 A1* | 3/2013 | Mei | ............... | H01M 4/92 |
| | | | | 429/482 |
| 2013/0273456 A1* | 10/2013 | Bae | ............... | H01M 4/8642 |
| | | | | 429/486 |
| 2013/0280638 A1* | 10/2013 | Levy | ............... | C04B 35/484 |
| | | | | 429/482 |

OTHER PUBLICATIONS

Kim et al., Catalytic Effect of Pd—Ni Bimetallic Catalysts on High-Temperature Co-Electrolysis of Steam/CO2 Mixtures, Journal of the Electrochemical Society, Aug. 24, 2016, F3171-F3178 (2016), vol. 163 (11).

* cited by examiner

Schematic of the Pd multilayers in AFL

I-V-P curves of the thin film-SOFC at variety of temperature

| Temperature (°C) | Peak power density (mW/cm²) |
|---|---|
| 650 | 1,833 |
| 600 | 1,456 |
| 550 | 933 |
| 500 | 432 |

CATALYST INTERLAYER FOR THE FUEL ELECTRODE OF THIN ELECTROLYTE SOLID OXIDE CELL AND METHOD OF FORMING THE SAME

CROSS-REFERENCE TO RELATED APPLICATIONS

This application claims priority under 35 U.S.C. § 119 to Korean Patent Application No. 10-2016-0132741 filed on Oct. 13, 2016 in the Korean Intellectual Property Office, the disclosure of which is incorporated herein by reference in its entirety.

TECHNICAL FIELD

The following disclosure relates to a catalyst interlayer for a thin electrolyte solid oxide cell, a thin electrolyte solid oxide cell including the same, and a method of forming the same.

BACKGROUND

A solid oxide cell (SOC) based on a ceramic ion conductor is a basis of the technique for electrochemically producing electricity or fuel at high temperature with high efficiency by using a solid oxide fuel cell (SOFC), a high-temperature solid oxide electrolysis cell (SOEC), a high-temperature co-electrolysis cell (Co-EC) or the like.

In these techniques, various hydrocarbon-based fuels are utilized in addition to hydrogen (the degree of freedom of fuel) for fuel cell operation, and at high-temperature co-electrolysis, water and carbon dioxide may be electrolyzed simultaneously to produce useful synthetic gas. To enhance such advantages and potentials, in addition to nickel (Ni) most frequently used at a fuel electrode, high-active catalysts (Pd, Ru, Rd, Fe, Co, Cu or the like) capable of promoting reactions and preventing carbon deposition need to be inserted and utilized.

In the existing technique, when a NiO—YSZ fuel electrode is prepared using a powder process, a catalyst such as Pd is mixed and then sintered, or a catalyst such as Pd is inserted into a sintered NiO—YSZ fuel electrode support solid oxide cell by means of infiltration or the like. In the former case, while the high-temperature sintering process is being performed, the catalyst may experience grain growth, which may reduce a surface area, decrease catalyst activity. In addition, inhomogeneous distribution of the catalyst may occur due to the imperfect powder mixing process. In the latter case, while the sintered solid oxide cell is being impregnated with a precursor solution containing a catalyst, the catalyst may not reach an interface of the electrolyte and the fuel electrode.

In addition, a catalyst layer may also be independently formed in the fuel electrode support of the solid oxide cell. However, basically, while a high-temperature sintering process is being performed, the catalyst grains may increase over a micron level to deteriorate catalyst activity, the catalyst substance may not be homogeneously inserted into the fuel electrode, and a physical or chemical defect may occur at the interface due to the difference in material from the fuel electrode.

RELATED LITERATURES

Non-Patent Literature

1. "In-situ nano-alloying Pd—Ni for economical control of syngas production from high-temperature thermo-electrochemical reduction of steam/$CO_2$", Appl. Cat. B, Environmental, 200, 265-273, 2017
2. "Catalytic Effect of Pd—Ni Bimetallic Catalysts on High-Temperature Co-Electrolysis of Steam/$CO_2$ Mixtures", J. Electrochem. Soc., 163 (11), F3171-F3178, 2016

SUMMARY

This technique is directed to inserting a heterogeneous catalyst into a fuel electrode functional layer in contact with an electrolyte by using a multilayer thin film process. In detail, this technique is directed to a method of forming a thin electrolyte solid oxide cell, in which a desired heterogeneous catalyst is inserted in a multilayer into a nanostructure fuel electrode functional layer so that the catalyst is distributed at a fuel electrode in contact with an electrolyte, thereby maximizing the catalyst effect and ensuring improved performance of the solid oxide cell during low-temperature operation.

In one general aspect of the present disclosure, there is provided an interlayer for a thin electrolyte solid oxide cell, composed of a multilayer comprising at least one structure of '(a) a nanostructure fuel electrode functional layer and (b) a heterogeneous catalyst layer forming an interface with the nanostructure fuel electrode functional layer'.

In another aspect of the present disclosure, there is provided a thin electrolyte solid oxide cell, comprising: (a) a fuel electrode; (b) an interlayer formed on the fuel electrode; (c) an electrolyte layer formed on the interlayer; (d) a buffer layer formed on the electrolyte layer; and (e) a cathode layer formed on the buffer layer, wherein the interlayer is the interlayer for a thin electrolyte solid oxide cell, defined in any one of embodiments of the present disclosure.

In another aspect of the present disclosure, there is provided a method of forming an interlayer for a thin electrolyte solid oxide cell, comprising: (A1) forming a first heterogeneous catalyst layer on a fuel electrode, and then forming a first nanostructure fuel electrode functional layer.

In another aspect of the present disclosure, there is provided a method of forming an interlayer for a thin electrolyte solid oxide cell, comprising: (B1) forming a nanostructure fuel electrode functional layer, which forms an interface with a fuel electrode, on the fuel electrode, forming a first heterogeneous catalyst layer thereon, and then forming a first nanostructure fuel electrode functional layer.

According to various embodiments of the present disclosure, functional elements (a fuel electrode, an electrolyte and a cathode) of the solid oxide cell are formed by means of a thin film process, and thus a nanostructure of the catalyst is not seriously lost due to agglomeration, different from a powder process. Thus, it is possible to accomplish catalyst activation according to a high specific surface area.

DETAILED DESCRIPTION OF EMBODIMENTS

Figure 1:
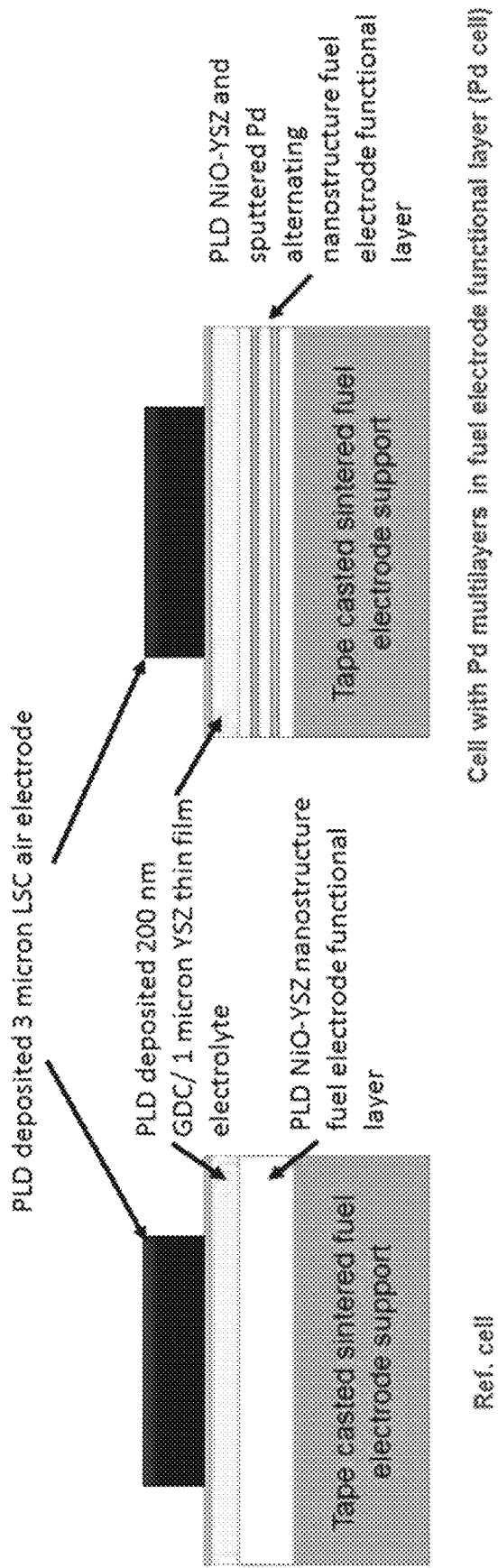
FIG. 1 is a diagram for comparing an existing standard thin film electrolyte cell (solid oxide cell: SOC) having no heterogeneous catalyst layer inserted into a nanostructure fuel electrode functional layer and a SOC of the present disclosure in which the heterogeneous catalyst layer is inserted.

Hereinafter, various examples and embodiments of the present disclosure will be described in detail.

An embodiment of the present disclosure is directed to an interlayer for a thin electrolyte solid oxide cell, composed of a multilayer including at least one structure of '(a) a nanostructure fuel electrode functional layer and (b) a heterogeneous catalyst layer forming an interface with the nanostructure fuel electrode functional layer'.

In an embodiment, the nanostructure fuel electrode functional layer of the present disclosure is a composite of doped zirconia, doped ceria, doped lanthanum gallate or the like, which are electrolyte materials of SOC, and Ni serving as the main catalyst substance of a fuel electrode, and is composed of at least one of NiO—YSZ, NiO—ScSZ, NiO-GDC, NiO—SDC, and NiO-LSGM.

In another embodiment, the nanostructure fuel electrode functional layer of the present disclosure may contain an oxide fuel electrode material of doped $SrTiO_3$, $(La,Sr)TiO_3$, $(La,Ca)TiO_3$, $LaCrO_3$, $(La,Sr)VO_3$ or the like, containing no Ni.

In addition, the heterogeneous catalyst layer of the present disclosure may be made of any material selected from the group consisting of Pd, Ru, Rd, Fe, Co, Cu, and alloys thereof.

At this time, the multilayer is located between a fuel electrode layer and an electrolyte layer of the thin electrolyte solid oxide cell.

In addition, among the nanostructure fuel electrode functional layer and the heterogeneous catalyst layer, the nanostructure fuel electrode functional layer forms an interface with the electrolyte layer. If the heterogeneous catalyst layer forms an interface with the electrolyte layer, when the electrolyte layer is formed, the metal of the heterogeneous catalyst layer may be agglomerated to make the deposition surface rough and thus deteriorate structural stability of the thin film electrolyte.

In the multilayer, the nanostructure fuel electrode functional layer and the heterogeneous catalyst layer are formed alternately.

In another embodiment, at a layer forming an interface with the fuel electrode layer, based on the order of layers forming the interface with the electrolyte layer, the multilayer includes a structure of 'heterogeneous catalyst layer/nanostructure fuel electrode functional layer'.

In another embodiment, at a layer forming an interface with the fuel electrode layer, based on the order of layers forming the interface with the electrolyte layer, the multilayer includes a structure of 'nanostructure fuel electrode functional layer forming an interface with the fuel electrode/first heterogeneous catalyst layer/first nanostructure fuel electrode functional layer'.

First, the case where the multilayer includes a structure of 'heterogeneous catalyst layer/nanostructure fuel electrode functional layer' will be described.

In an embodiment, the multilayer includes at least one structure of 'additional heterogeneous catalyst layer/additional nanostructure fuel electrode functional layer' on the structure of 'heterogeneous catalyst layer/nanostructure fuel electrode functional layer'.

In another embodiment, the multilayer may include any one of the following ① to ⑪ structures. However, the multilayers listed below are just examples, and it is obvious that additional multilayers are coupled to the following multilayers to form another multilayer according to the present disclosure. In addition, in the present disclosure, if several layers are distinguishably recited using a symbol '/', it should be understood that a layer forming an interface with the fuel electrode layer is recited first, and a layer forming an interface with the electrolyte layer is recited later.

① first heterogeneous catalyst layer/first nanostructure fuel electrode functional layer, ② first heterogeneous catalyst layer/first nanostructure fuel electrode functional layer/second heterogeneous catalyst layer/second nanostructure fuel electrode functional layer, ③ first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer, ④ first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer, ⑤ first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer/fifth heterogeneous catalyst layer/fifth nanostructure fuel electrode functional layer, ⑥ first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer/fifth heterogeneous catalyst layer/fifth nanostructure fuel electrode functional layer/sixth heterogeneous catalyst layer/sixth nanostructure fuel electrode functional layer, ⑦ first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer/fifth heterogeneous catalyst layer/fifth nanostructure fuel electrode functional layer/sixth heterogeneous catalyst layer/sixth nanostructure fuel electrode functional layer/seventh heterogeneous catalyst layer/seventh nanostructure fuel electrode functional layer, ⑧ first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer/fifth heterogeneous catalyst layer/fifth nanostructure fuel electrode functional layer/sixth heterogeneous catalyst layer/sixth nanostructure fuel electrode functional layer/seventh heterogeneous catalyst layer/seventh nanostructure fuel electrode functional layer/eighth heterogeneous catalyst layer/eighth nanostructure fuel electrode functional layer, ⑨ first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer/fifth heterogeneous catalyst layer/fifth nanostructure fuel electrode functional layer/sixth heterogeneous catalyst layer/sixth nanostructure fuel electrode functional layer/seventh heterogeneous catalyst layer/seventh nanostructure fuel electrode functional layer/eighth heterogeneous catalyst layer/eighth nanostructure fuel electrode functional layer/ninth heterogeneous catalyst layer/ninth nanostructure fuel electrode functional layer, ⑩ first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer/fifth heterogeneous catalyst layer/fifth nanostructure fuel electrode functional layer/sixth heterogeneous catalyst layer/sixth nanostructure fuel electrode functional layer/seventh heterogeneous catalyst layer/seventh nanostructure fuel electrode functional layer/eighth heterogeneous catalyst layer/eighth nanostructure fuel electrode functional layer/ninth heterogeneous catalyst layer/ninth nanostructure fuel electrode functional layer/tenth heterogeneous catalyst layer/tenth nanostructure fuel electrode functional layer.

Next, the case where at a layer forming an interface with the fuel electrode layer, based on the order of layers forming the interface with the electrolyte layer, the multilayer includes a structure of 'nanostructure fuel electrode functional layer forming an interface with the fuel electrode/first heterogeneous catalyst layer/first nanostructure fuel electrode functional layer' is explained.

In this case, also, the multilayer may include at least one structure of 'additional heterogeneous catalyst layer/additional nanostructure fuel electrode functional layer' on the structure of 'nanostructure fuel electrode functional layer forming an interface with the fuel electrode/first heterogeneous catalyst layer/first nanostructure fuel electrode functional layer'.

In another embodiment, at a layer forming an interface with the fuel electrode layer, based on the order of layers forming the interface with the electrolyte layer, the multilayer may include any one of the following ① to ⑩ structures. Here, the multilayers listed below are just examples, and it is obvious that additional multilayers are coupled to the following multilayers to form another multilayer according to the present disclosure.

① nanostructure fuel electrode functional layer forming an interface with the fuel electrode/first heterogeneous catalyst layer/first nanostructure fuel electrode functional layer, ② nanostructure fuel electrode functional layer forming an interface with the fuel electrode/first heterogeneous catalyst layer/first nanostructure fuel electrode functional layer/second heterogeneous catalyst layer/second nanostructure fuel electrode functional layer, ③ nanostructure fuel electrode functional layer forming an interface with the fuel electrode/first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer, ④ nanostructure fuel electrode functional layer forming an interface with the fuel electrode/first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer, ⑤ nanostructure fuel electrode functional layer forming an interface with the fuel electrode/first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer/fifth heterogeneous catalyst layer/fifth nanostructure fuel electrode functional layer, ⑥ nanostructure fuel electrode functional layer forming an interface with the fuel electrode/first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer/fifth heterogeneous catalyst layer/ fifth nanostructure fuel electrode functional layer/sixth heterogeneous catalyst layer/sixth nanostructure fuel electrode functional layer, ⑦ nanostructure fuel electrode functional layer forming an interface with the fuel electrode/first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer/fifth heterogeneous catalyst layer/fifth nanostructure fuel electrode functional layer/sixth heterogeneous catalyst layer/sixth nanostructure fuel electrode functional layer/seventh heterogeneous catalyst layer/seventh nanostructure fuel electrode functional layer, ⑧ nanostructure fuel electrode functional layer forming an interface with the fuel electrode/first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer/fifth heterogeneous catalyst layer/fifth nanostructure fuel electrode functional layer/sixth heterogeneous catalyst layer/sixth nanostructure fuel electrode functional layer/seventh heterogeneous catalyst layer/seventh nanostructure fuel electrode functional layer/eighth heterogeneous catalyst layer/eighth nanostructure fuel electrode functional layer, ⑨ nanostructure fuel electrode functional layer forming an interface with the fuel electrode/first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer/fifth heterogeneous catalyst layer/fifth nanostructure fuel electrode functional layer/sixth heterogeneous catalyst layer/sixth nanostructure fuel electrode functional layer/seventh heterogeneous catalyst layer/seventh nanostructure fuel electrode functional layer/eighth heterogeneous catalyst layer/eighth nanostructure fuel electrode functional layer/ninth heterogeneous catalyst layer/ninth nanostructure fuel electrode functional layer, ⑩ nanostructure fuel electrode functional layer forming an interface with the fuel electrode/first heterogeneous catalyst layer/first nanostructure fuel electrode functional layer/second heterogeneous catalyst layer/second nanostructure fuel electrode functional layer/third heterogeneous catalyst layer/third nanostructure fuel electrode functional layer/fourth heterogeneous catalyst layer/fourth nanostructure fuel electrode functional layer/fifth heterogeneous catalyst layer/fifth nanostructure fuel electrode functional layer/sixth heterogeneous catalyst layer/sixth nanostructure fuel electrode functional layer/seventh heterogeneous catalyst layer/seventh nanostructure fuel electrode functional layer/eighth heterogeneous catalyst layer/eighth nanostructure fuel electrode functional layer/ninth heterogeneous catalyst layer/ninth nanostructure fuel electrode functional layer/tenth heterogeneous catalyst layer/tenth nanostructure fuel electrode functional layer.

In another embodiment, at least one of the one or more heterogeneous catalyst layers has a thickness of 2 to 25 nm.

In another embodiment, at least one of the one or more heterogeneous catalyst layers has a thickness of 5 to 20 nm.

In another embodiment, all of the one or more heterogeneous catalyst layers have a thickness of 2 to 25 nm.

In another embodiment, all of the one or more heterogeneous catalyst layers have a thickness of 10 to 20 nm.

If the heterogeneous catalyst layer has a thickness less than 5 nm, the amount of inserted catalyst may be not enough. This problem may be overcome by inserting several layers, which however increases the process complexity. If the heterogeneous catalyst layer has a thickness greater than 20 nm, the roughness increases during an agglomerating process, which may cause a problem in deposition or cause delamination by pushing a following layer due to agglomeration.

Therefore, in order to solve the surface roughness and the delamination, all heterogeneous catalyst layers should have a thickness of 5 to 20 nm. However, the present disclosure should be also regarded as encompassing not only a case where all heterogeneous catalyst layers have a thickness within the above range but also a case where only some heterogeneous catalyst layers have a thickness within the above range to ensure the above advantageous effects while the other layers bear the surface roughness and the delamination.

Another embodiment of the present disclosure is directed to a thin electrolyte solid oxide cell, which includes (a) a fuel electrode, (b) an interlayer formed on the fuel electrode, (c) an electrolyte layer formed on the interlayer, (d) a buffer layer formed on the electrolyte layer, and (e) a cathode layer formed on the buffer layer, wherein the interlayer is the interlayer for a thin electrolyte solid oxide cell according to one of the embodiments of the present disclosure.

Another embodiment of the present disclosure is directed to a method of forming an interlayer for a thin electrolyte solid oxide cell, which includes (A1) forming a first heterogeneous catalyst layer on a fuel electrode, and then forming a first nanostructure fuel electrode functional layer.

Another embodiment of the present disclosure is directed to a method of forming an interlayer for a thin electrolyte solid oxide cell, which includes (B1) forming a nanostructure fuel electrode functional layer, which forms an interface with a fuel electrode, on the fuel electrode, forming a first heterogeneous catalyst layer thereon, and then forming a first nanostructure fuel electrode functional layer.

First, the method of forming an interlayer for a thin electrolyte solid oxide cell, which includes (A1) forming a first heterogeneous catalyst layer on a fuel electrode, and then forming a first nanostructure fuel electrode functional layer, will be described.

In an embodiment, after the step (A1), the method further includes (A1') performing a process of forming an additional heterogeneous catalyst layer and then forming an additional nanostructure fuel electrode functional layer at least once.

In another embodiment, after the step (A1), any one of the following processes ① to ⑤ is further included.

① (A2) forming a second heterogeneous catalyst layer on the first nanostructure fuel electrode functional layer and then forming a second nanostructure fuel electrode functional layer;

② (A2) forming a second heterogeneous catalyst layer on the first nanostructure fuel electrode functional layer and then forming a second nanostructure fuel electrode functional layer, (A3) forming a third heterogeneous catalyst layer on the second nanostructure fuel electrode functional layer and then forming a third nanostructure fuel electrode functional layer;

③ (A2) forming a second heterogeneous catalyst layer on the first nanostructure fuel electrode functional layer and then forming a second nanostructure fuel electrode functional layer, (A3) forming a third heterogeneous catalyst layer on the second nanostructure fuel electrode functional layer and then forming a third nanostructure fuel electrode functional layer, (A4) forming a fourth heterogeneous catalyst layer on the third nanostructure fuel electrode functional layer and then forming a fourth nanostructure fuel electrode functional layer;

④ (A2) forming a second heterogeneous catalyst layer on the first nanostructure fuel electrode functional layer and then forming a second nanostructure fuel electrode functional layer, (A3) forming a third heterogeneous catalyst layer on the second nanostructure fuel electrode functional layer and then forming a third nanostructure fuel electrode functional layer, (A4) forming a fourth heterogeneous catalyst layer on the third nanostructure fuel electrode functional layer and then forming a fourth nanostructure fuel electrode functional layer, (A5) forming a fifth heterogeneous catalyst layer on the fourth nanostructure fuel electrode functional layer and then forming a fifth nanostructure fuel electrode functional layer; and ⑤ (A2) forming a second heterogeneous catalyst layer on the first nanostructure fuel electrode functional layer and then forming a second nanostructure fuel electrode functional layer, (A3) forming a third heterogeneous catalyst layer on the second nanostructure fuel electrode functional layer and then forming a third nanostructure fuel electrode functional layer, (A4) forming a fourth heterogeneous catalyst layer on the third nanostructure fuel electrode functional layer and then forming a fourth nanostructure fuel electrode functional layer, (A5) forming a fifth heterogeneous catalyst layer on the fourth nanostructure fuel electrode functional layer and then forming a fifth nanostructure fuel electrode functional layer, (A6) forming a sixth heterogeneous catalyst layer on the fifth nanostructure fuel electrode functional layer and then forming a sixth nanostructure fuel electrode functional layer.

Next, the method of forming an interlayer for a thin electrolyte solid oxide cell, which includes (B1) forming a nanostructure fuel electrode functional layer, which forms an interface with a fuel electrode, on the fuel electrode, forming a first heterogeneous catalyst layer thereon, and then forming a first nanostructure fuel electrode functional layer, will be described.

In an embodiment, after the step (B1), the method further includes (B1') performing a process of forming an additional heterogeneous catalyst layer and forming an additional nanostructure fuel electrode functional layer at least once.

In another embodiment, after the step (B1), any one of the following processes ① to ⑤ is further included.

① (B2) forming a second heterogeneous catalyst layer on the first nanostructure fuel electrode functional layer and then forming a second nanostructure fuel electrode functional layer;

② (B2) forming a second heterogeneous catalyst layer on the first nanostructure fuel electrode functional layer and then forming a second nanostructure fuel electrode functional layer, (B3) forming a third heterogeneous catalyst layer on the second nanostructure fuel electrode functional layer and then forming a third nanostructure fuel electrode functional layer;

③ (B2) forming a second heterogeneous catalyst layer on the first nanostructure fuel electrode functional layer and then forming a second nanostructure fuel electrode functional layer, (B3) forming a third heterogeneous catalyst layer on the second nanostructure fuel electrode functional layer and then forming a third nanostructure fuel electrode functional layer, (B4) forming a fourth heterogeneous catalyst layer on the third nanostructure fuel electrode functional layer and then forming a fourth nanostructure fuel electrode functional layer;

④ (B2) forming a second heterogeneous catalyst layer on the first nanostructure fuel electrode functional layer and then forming a second nanostructure fuel electrode functional layer, (B3) forming a third heterogeneous catalyst layer on the second nanostructure fuel electrode functional layer and then forming a third nanostructure fuel electrode functional layer, (B4) forming a fourth heterogeneous catalyst layer on the third nanostructure fuel electrode functional layer and then forming a fourth nanostructure fuel electrode functional layer, (B5) forming a fifth heterogeneous catalyst layer on the fourth nanostructure fuel electrode functional layer and then forming a fifth nanostructure fuel electrode functional layer; and ⑤ (B2) forming a second heterogeneous catalyst layer on the first nanostructure fuel electrode functional layer and then forming a second nanostructure fuel electrode functional layer, (B3) forming a third heterogeneous catalyst layer on the second nanostructure fuel electrode functional layer and then forming a third nanostructure fuel electrode functional layer, (B4) forming a fourth heterogeneous catalyst layer on the third nanostructure fuel electrode functional layer and then forming a fourth nanostructure fuel electrode functional layer, (B5) forming a fifth heterogeneous catalyst layer on the fourth nanostructure fuel electrode functional layer and then forming a fifth nanostructure fuel electrode functional layer, (B6) forming a sixth heterogeneous catalyst layer on the fifth nanostructure fuel electrode functional layer and then forming a sixth nanostructure fuel electrode functional layer.

In another embodiment, the heterogeneous catalyst layer is formed by means of sputtering, and the nanostructure fuel electrode functional layer is formed by means of pulsed laser deposition (PLD).

In another embodiment, the sputtering is performed at normal temperature, and the PLD is performed at 600 to 800° C.

Hereinafter, some embodiments of the present disclosure will be described in more detail. However, the scope of the present disclosure is not limited to the following description.

According to the present disclosure, when a fuel electrode functional layer is formed by means of a thin film process, a heterogeneous catalyst layer is inserted therein with a multilayer thin film structure.

As shown in FIG. 1, if a unit cell (Ref. cell) in which a heterogeneous catalyst is not inserted is a fuel electrode support type structure, a fuel electrode support and a fuel electrode functional layer are formed with NiO—YSZ to include Ni which is a common fuel electrode catalyst. However, in the present disclosure, a heterogeneous catalyst is inserted into the fuel electrode functional layer.

In the embodiment of the present disclosure, Pd is selected as the heterogeneous catalyst, but the present disclosure is not limited thereto.

Figure 2:
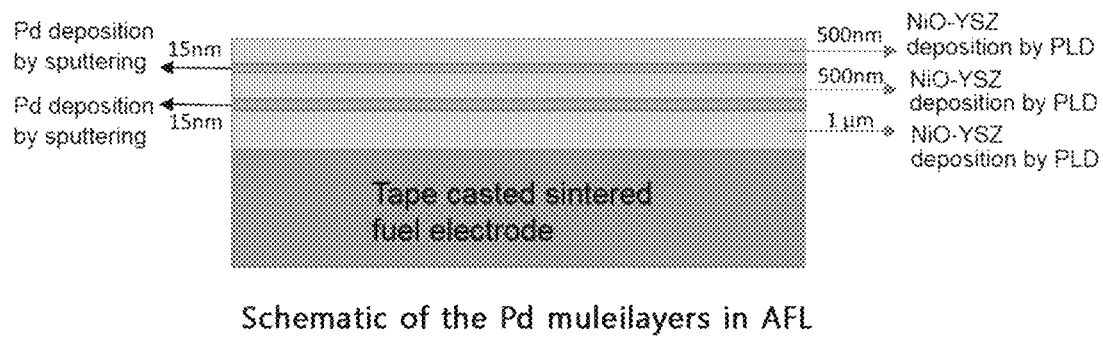
FIG. 2 is a diagram showing a structure in which a heterogeneous catalyst layer of Example 1-6 according to the present disclosure is inserted.

The heterogeneous catalyst may be inserted by forming a NiO—YSZ nanostructure fuel electrode functional layer and a Pd catalyst layer into a multilayer as shown in FIG. 2.

Hereinafter, the present disclosure will be described in more detail using examples, but the scope and content of the present disclosure should not be restricted or limitedly interpreted due to the examples. In addition, based on the present disclosure including the examples, it would be obvious that the present disclosure can be easily implemented by those skilled in the art even though detailed experimental results are not proposed, and such changes and modifications also fall within the scope of the appended claims.

In addition, the experimental results proposed herein are just representative experimental results of Examples and Comparative Examples, and effects of various embodiments of the present disclosure not proposed herein will be described in detail in appropriate portions.

EXAMPLES

Examples 1-1 to 1-3

Figure 3A:
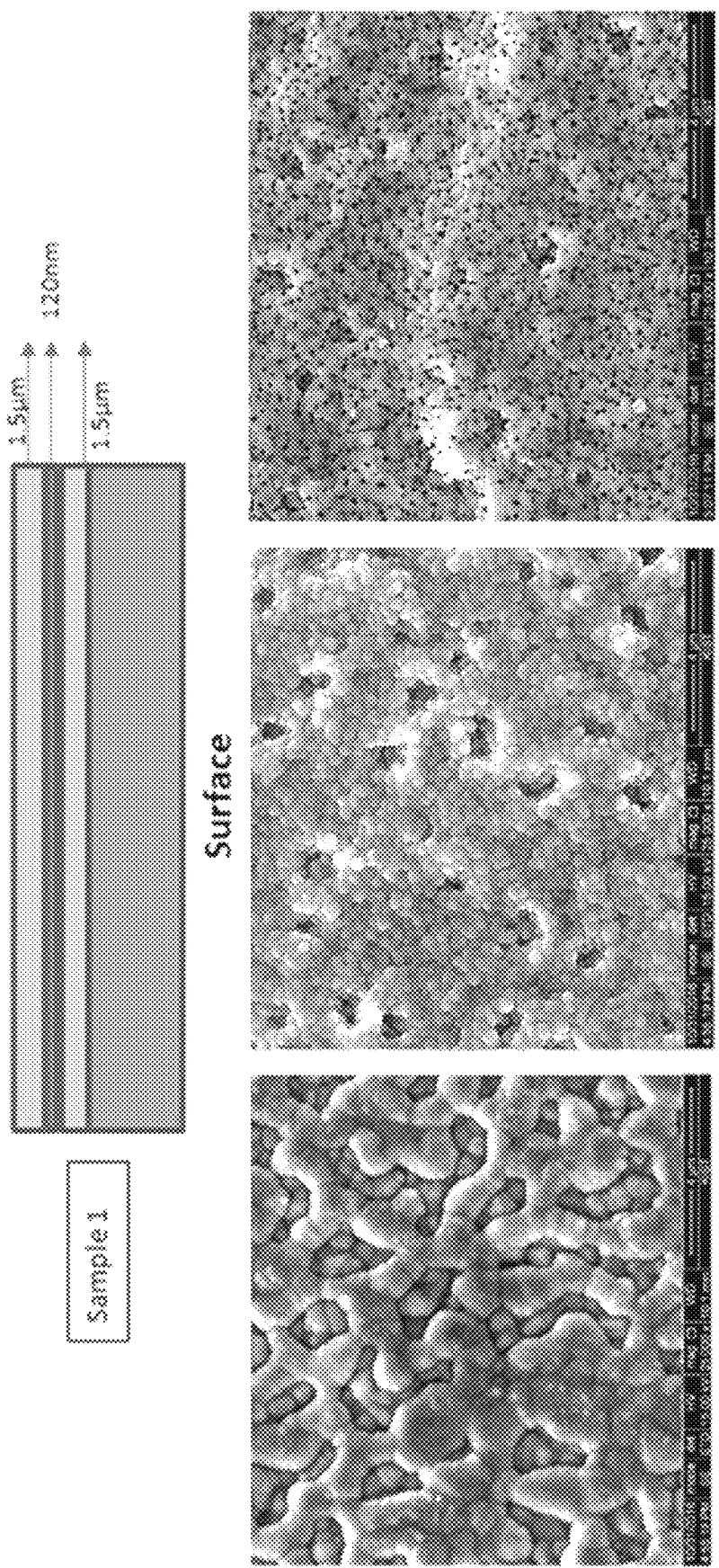
FIGS. 3A to 3C are diagrams showing structures in which the heterogeneous catalyst layers proposed in Examples 1-1 to 1-3 are inserted, and resultant scanning electron microscope (SEM) photographs. These diagrams show thickness of a non-optimized heterogeneous catalyst layer, and surface roughness and delamination caused by the multilayered structure.
Figure 3B:
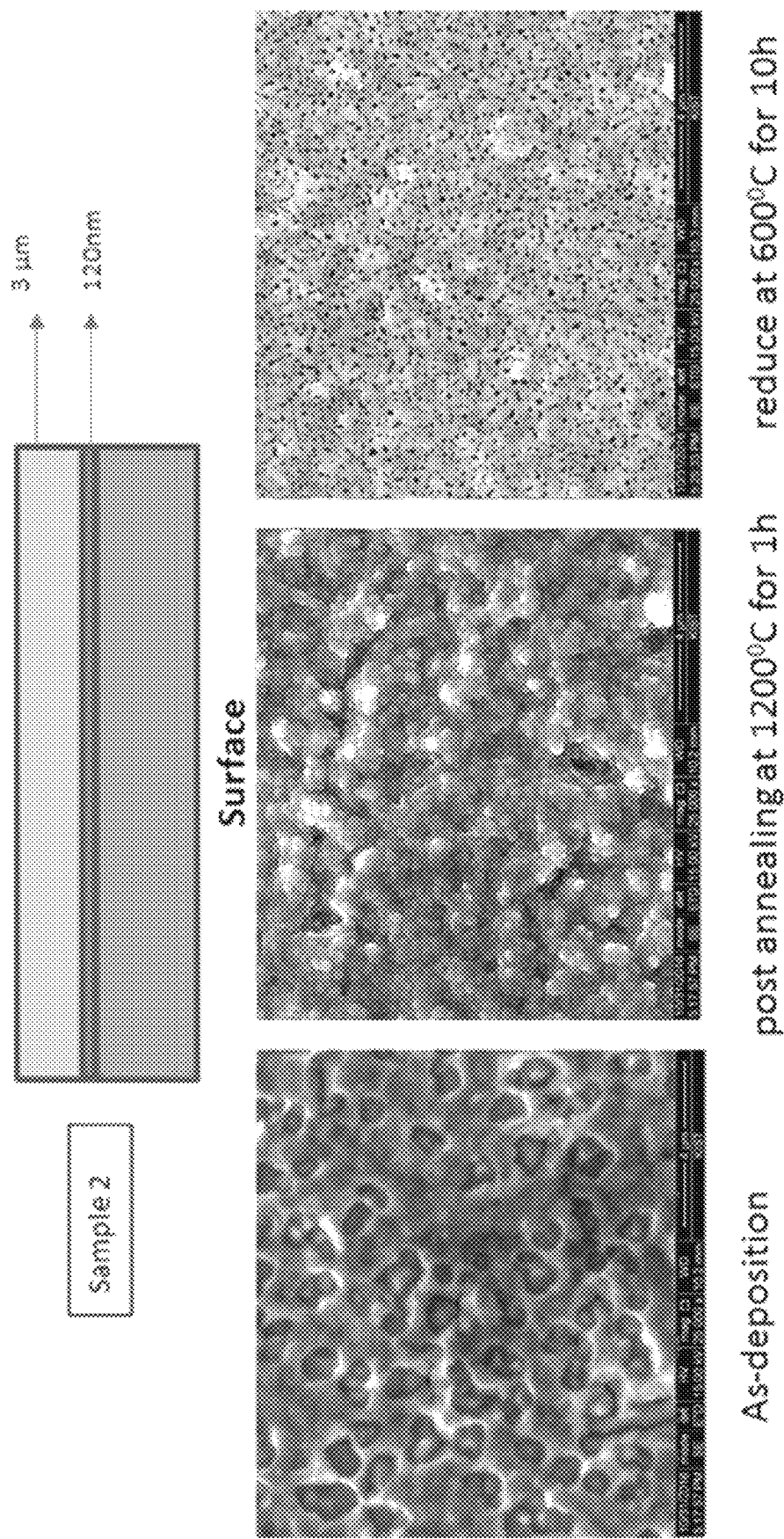
Figure 3C:
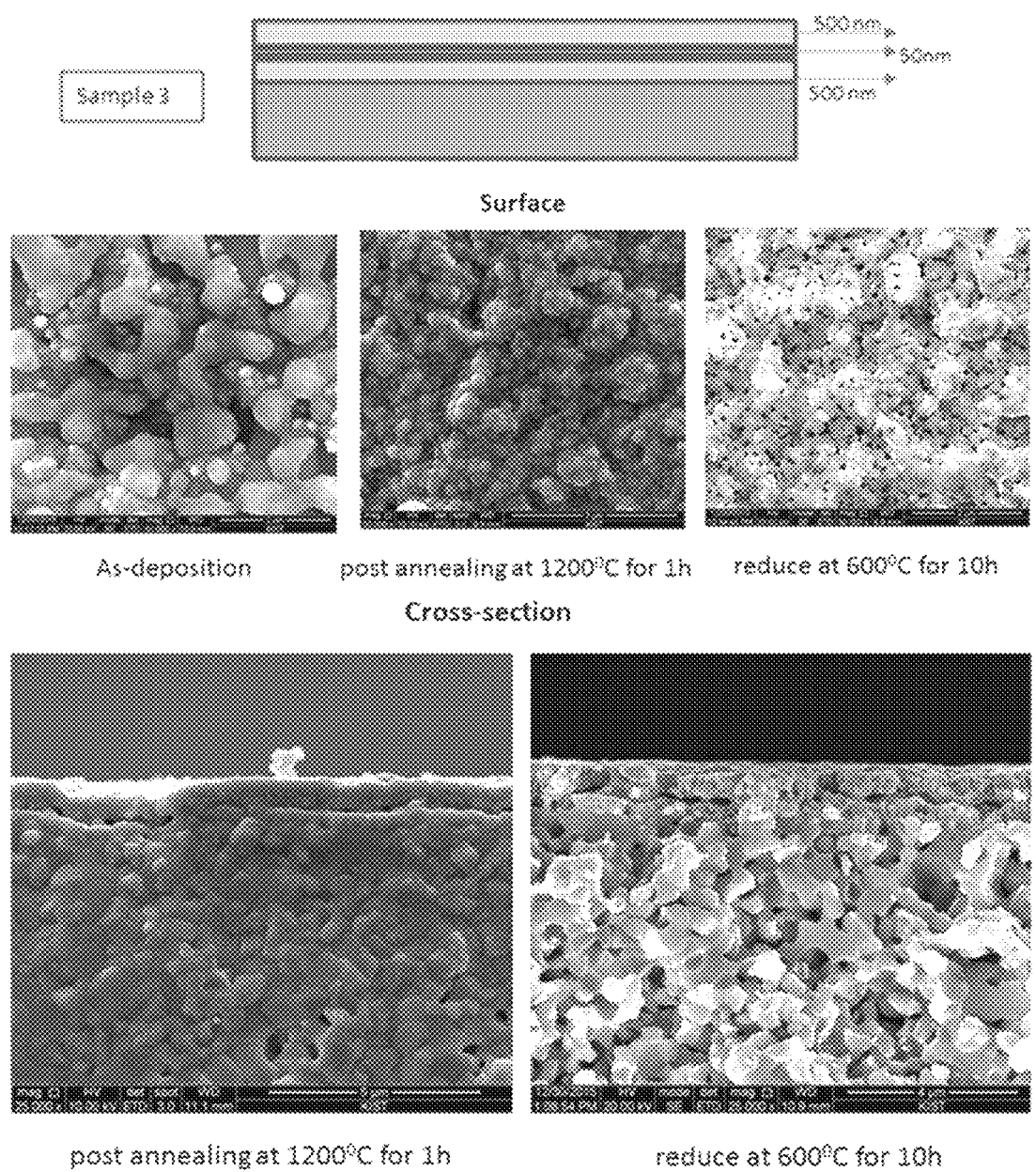

The structures as proposed in FIGS. 3A to 3C were fabricated in Examples 1-1 to 1-3, respectively. In other words, a green layer, a yellow-green layer and a red layer respectively represent a fuel layer, a Ni—YSZ interlayer, and a Pd heterogeneous catalyst layer. The NiO—YSZ interlayer was deposited with PLD at 700° C. under an oxygen process pressure of 50 mTorr by using a NiO—YSZ (NiO:YSZ=56:44 wt %) composite target, and the Pd heterogeneous catalyst layer was deposited by means of RF sputtering under an argon process pressure of 5 mTorr at room temperature by using a Pd target (with purity of 99.99%).

In the structures prepared in Examples 1-1 to 1-3, it was found that Pd was agglomerated when a substrate temperature is raised while additionally forming a NiO—YSZ at 700° C. on the deposited Pd. If Pd had a thickness greater than 50 nm, the surface roughness was greatly noticeable, and after reduction, it was found that delamination occurred at a place where Pd was present.

After the multilayer structure was completely formed, post heat treatment was performed at 1,200° C. for 1 hour under an air atmosphere so that excessive agglomeration of Ni does not occur at the NiO—YSZ layer during reduction. In order to observe a fine structure after reduction, the structure was reduced at 600° C. for 10 hours under a 4% hydrogen (96% argon) gas atmosphere.

Examples 1-4 and 1-5

Figure 4:
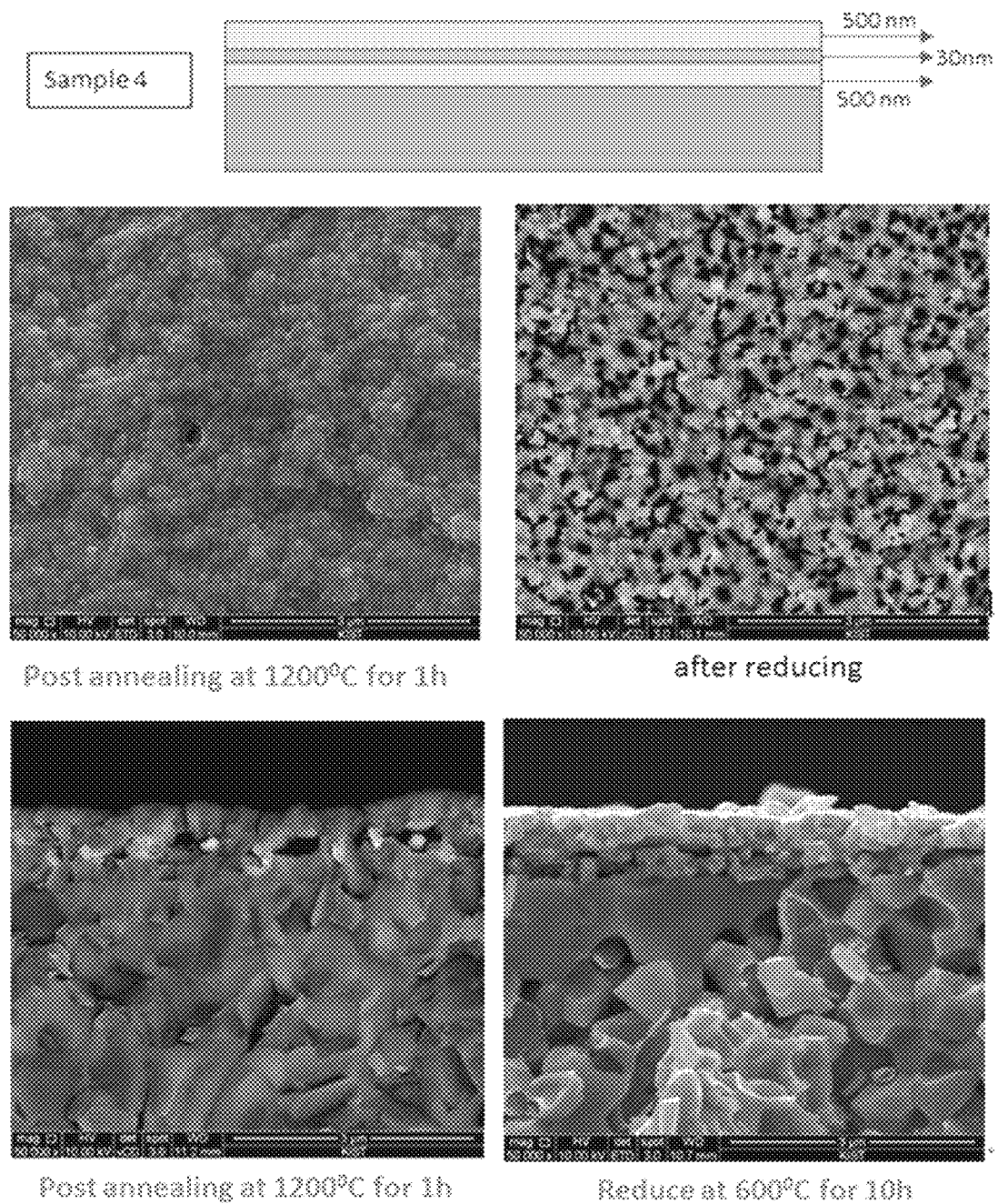
FIG. 4 shows a surface and a section of a fuel electrode when a lower nanostructure fuel electrode functional layer of Example 1-4 is formed as much as 500 nm, then a heterogeneous catalyst layer is reduced to 30 nm, and a nanostructure fuel electrode functional layer thereon is raised to 500 nm.
Figure 5:
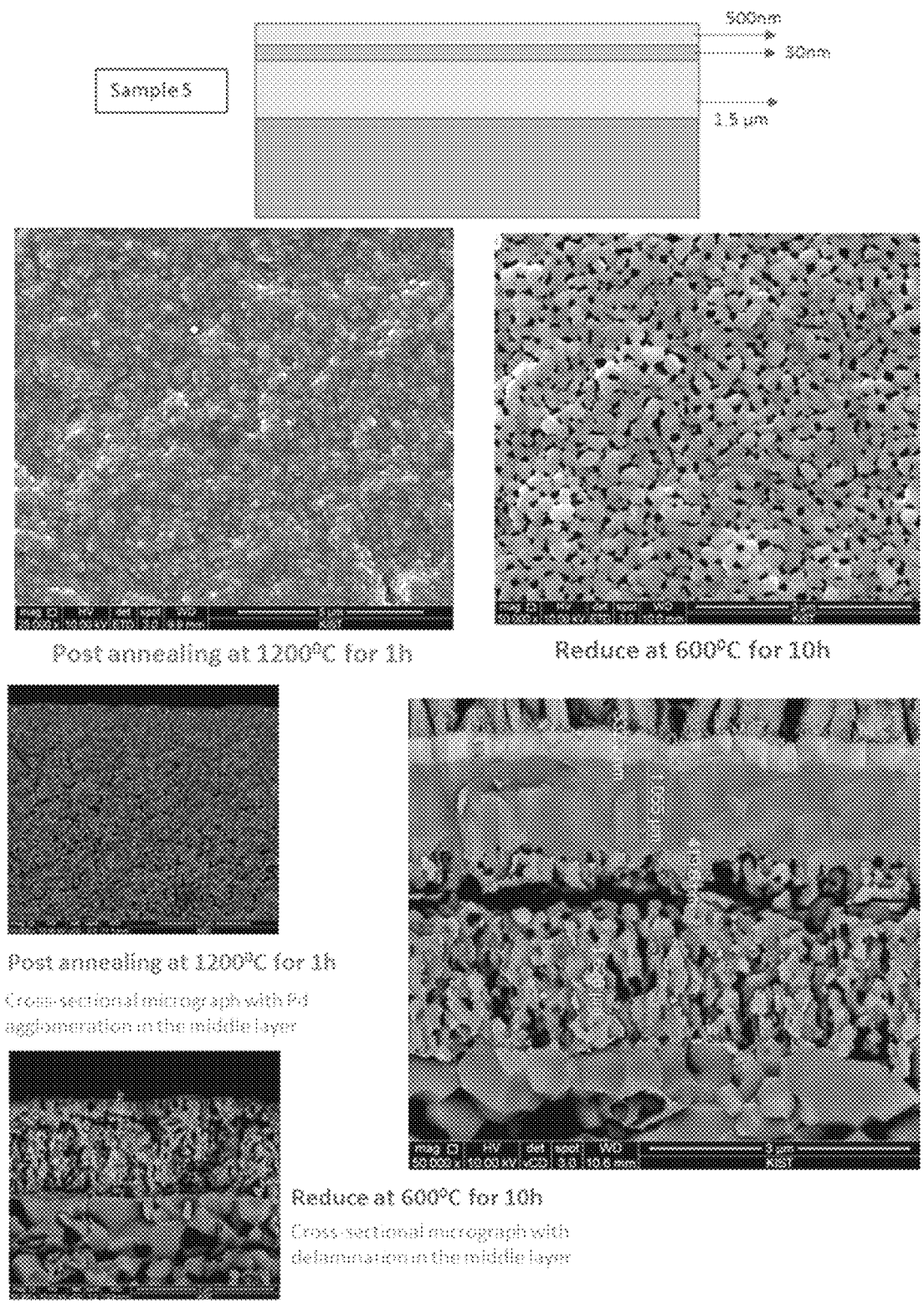
FIG. 5 shows a surface and a section of a fuel electrode when a lower nanostructure fuel electrode functional layer of Example 1-5 is formed as much as 1.5 micron, then a heterogeneous catalyst layer is reduced to 30 nm, and a nanostructure fuel electrode functional layer thereon is raised to 500 nm, and a photograph showing a section of a SOC prepared using the same.

A structure was formed in the same way as Example 1-1, except that the structures proposed in FIGS. 4 and 5 were formed in Examples 1-4 and 1-5, respectively, instead of the structure proposed in FIG. 1. As the thickness of the Pd layer was reduced to 30 nm, the surface was so flat to form a thin film electrolyte thereon, but at the section, delamination was observed at a portion where Pd was present.

Example 1-6

Figure 6:
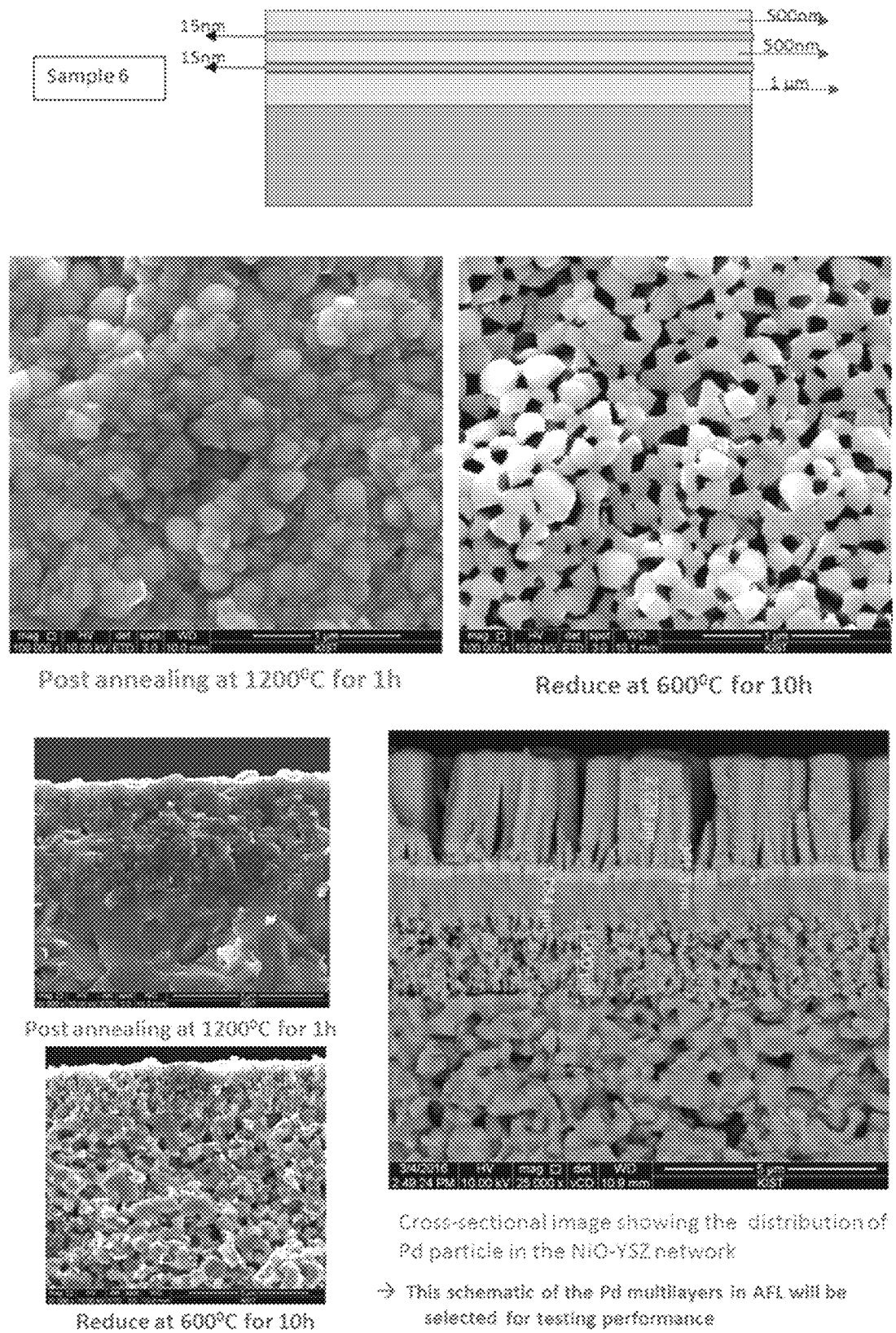
FIG. 6 shows a fine structure of a surface and a section of a fuel electrode in which the heterogeneous catalyst layer of Example 1-6 is inserted, and a fine structure of a section of a thin film SOC prepared based thereon according to Example 2-6.
Figure 7:
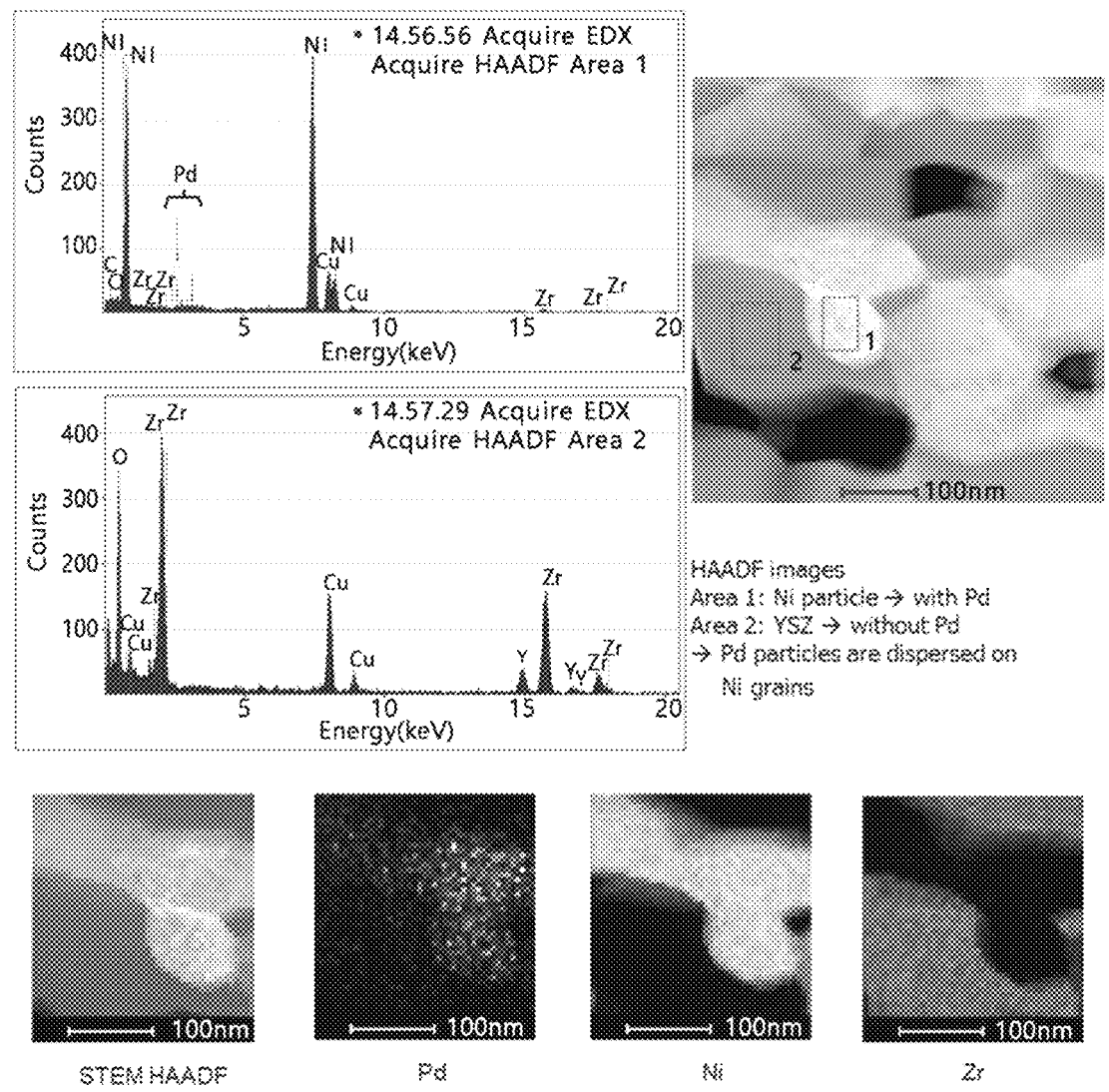
FIG. 7 shows analysis data of EDS components of a nanostructure fuel electrode functional layer according to Example 2-6, which reveals that Pd serving as a heterogeneous catalyst is uniformly alloyed with Ni serving as an existing catalyst and distributed.
Figures 8A, 8B:
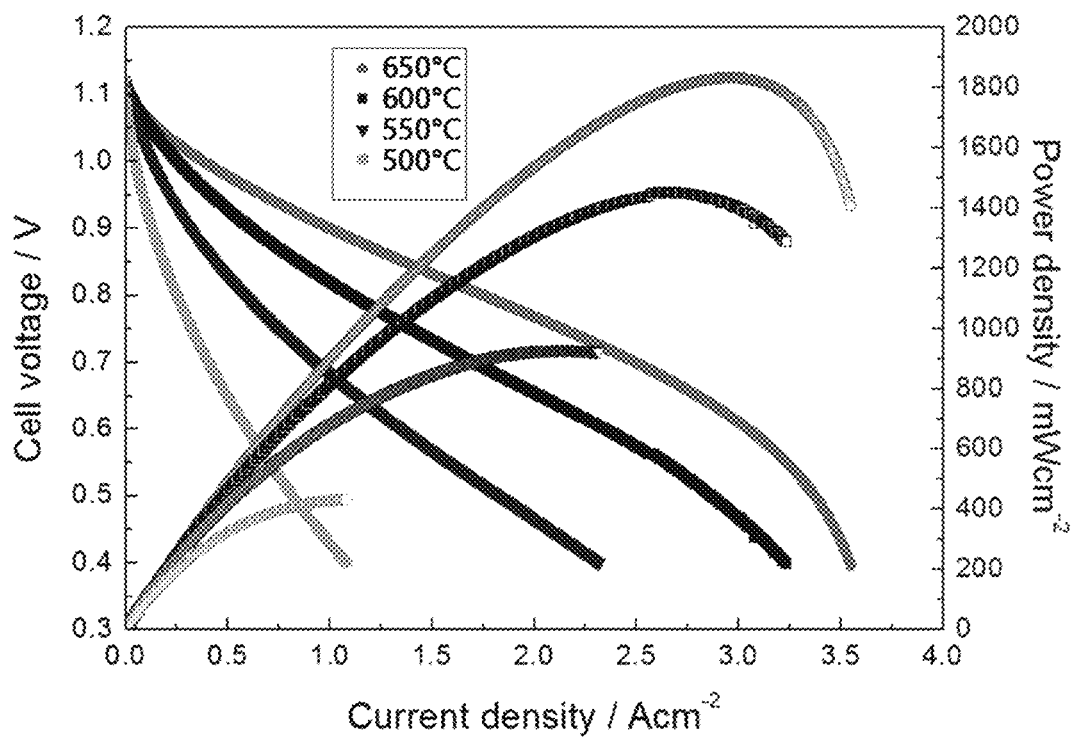
FIGS. 8A and 8B are a graph and a table showing SOFC operation characteristics of a thin film SOC in which a heterogeneous catalyst of Example 2-6 is inserted.
Figure 9:
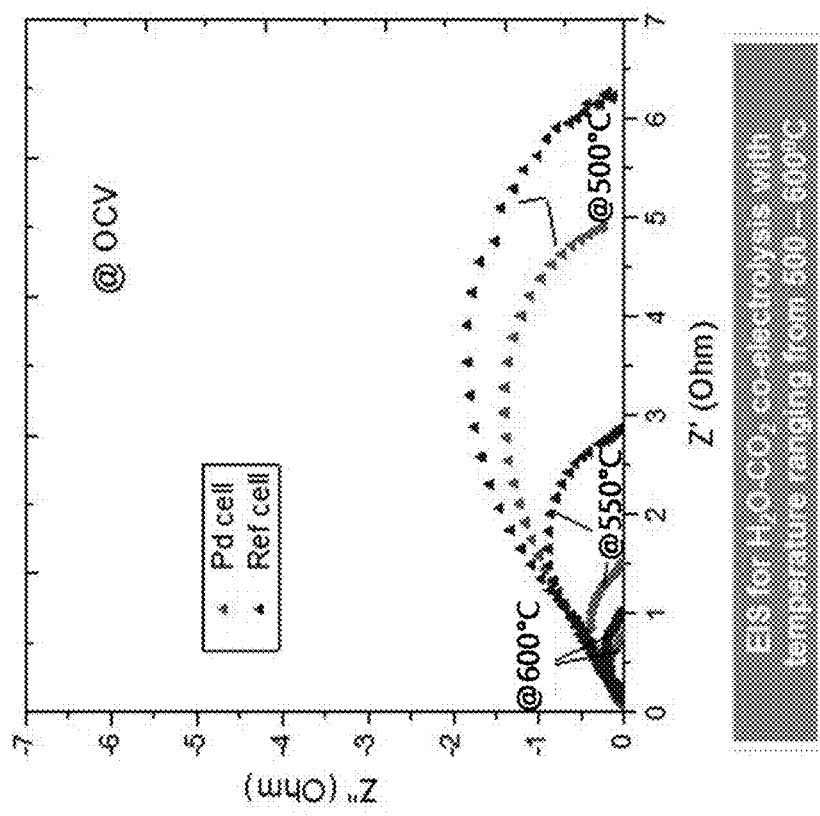
FIG. 9 is a graph showing current density-voltage curves for comparing co-electrolysis of a thin film SOC in which the heterogeneous catalyst of Example 2-6 is inserted and a thin film SOC in which the heterogeneous catalyst is not inserted, and their comparative electrochemical impedance results.
Figure 9:
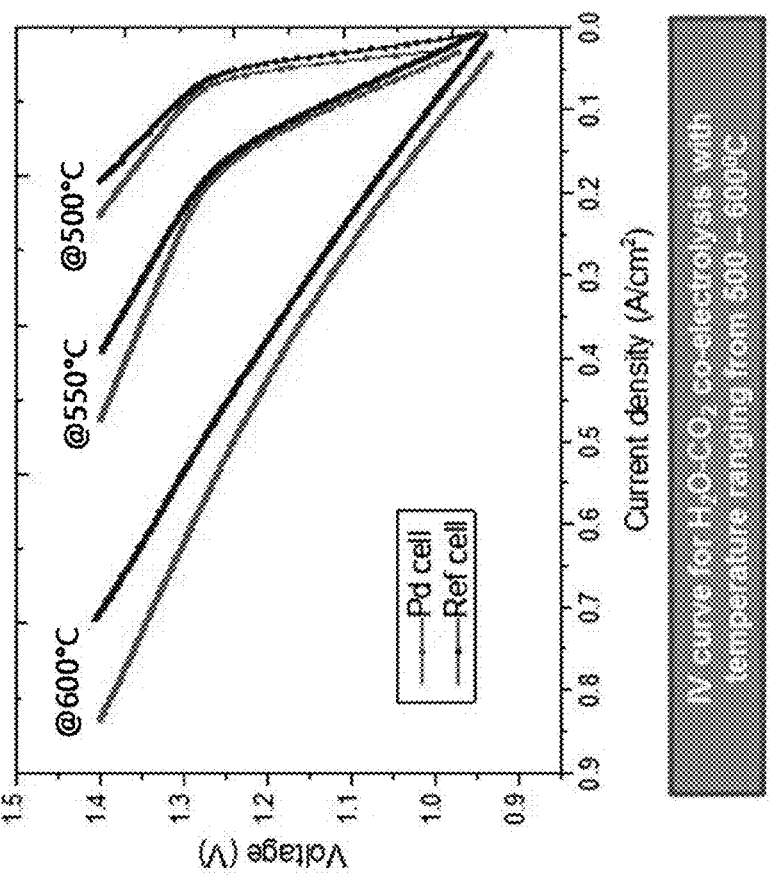
Figure 10:
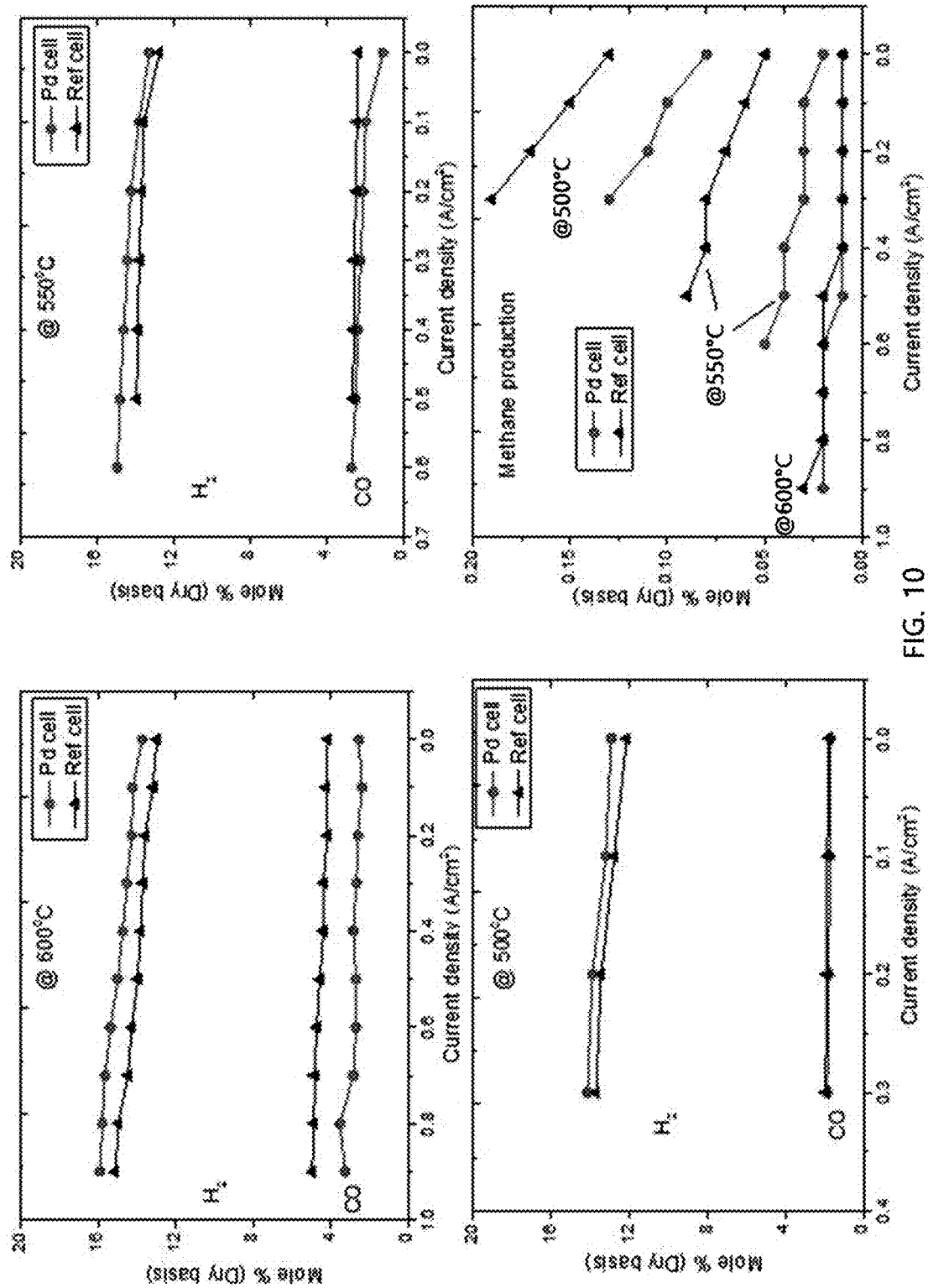
FIG. 10 is a graph for comparing fractions of hydrogen and carbon monoxide, generated by co-electrolysis of a thin film SOC in which the heterogeneous catalyst of Example 2-6 is inserted and a thin film SOC in which the heterogeneous catalyst is not inserted, and a graph for comparing the generation of methane.

A structure was formed in the same way as Example 1-1, except that the structure proposed in FIG. 6 was formed, instead of the structure proposed in FIG. 1. When the Pd layer with a thickness of 30 nm was divided into two layers with a thickness of 15 nm, it was found that the structure was satisfactory at both the surface and the cross-section.

As described above, using various multilayer configurations, it was found that if the heterogeneous catalyst layer had a great thickness and the NiO—YSZ layer deposited thereon is not sufficient, the agglomeration of Pd is not fully covered, which may cause so severe roughness at the surface not to form a dense thin film electrolyte at the surface and also may cause delamination between layers. In addition, it was found that inserting a plurality of relatively thinner layers is more desirable than forming a single thick layer.

Example 2-6

A fuel electrode-supporting thin film SOC having the interlayer of Example 1-6 was prepared. Characteristics and properties of the thin film SOC are as follows.

As a common process for forming the fuel electrode-supporting thin film SOC according to the prior research results of the inventor, the NiO—YSZ layer deposited by means of a thin film process was thermally treated at 1,200° C. for 1 hour in order to prevent Ni agglomeration. In this process, it was found that Pd of the interlayer according to Example 1-6 naturally formed an alloy with a Ni catalyst and was uniformly distributed at the fuel electrode functional layer.

When the heterogeneous catalyst layer was inserted as in Example 1-6 to form a thin film electrolyte SOC, the performance of the solid oxide fuel cell (SOFC) was evaluated using hydrogen as a fuel, and it was found that there was no deterioration in OCV or performance even though the heterogeneous catalyst layer was inserted. This means that the nanostructure fuel electrode in which the catalyst layer is inserted has surface flatness and structural stability so that an upper thin film electrolyte is densely formed, similar to an existing nanostructure fuel electrode.

In order to check the effects obtained by inserting the heterogeneous catalyst, carbon dioxide, moisture and hydrogen were supplied together, and the performance of co-electrolysis of carbon dioxide and moisture was compared with a standard case where Pd is not inserted.

When the co-electrolysis was performed at a relatively low temperature of 500 to 600° C., it was found that a unit cell in which Pd was inserted had improved results in the co-electrolysis performance and the polarization resistance, at any temperature condition.

By inserting the Pd catalyst, an amount of hydrogen was increased and an amount of carbon monoxide was decreased, in comparison to a standard unit cell, and it was also found that the production of methane was reduced. This shows that Pd plays an important role in preventing the generation of carbon.

According to the present disclosure, various kinds of heterogeneous catalysts may be reliably and conveniently inserted by means of a thin film process, and if the heterogeneous catalyst is disposed close to an interface of an electrolyte and an electrode, it is expected that the effect of the heterogeneous catalyst may be maximized.

Since the deposition may be performed with a catalyst substance as a target regardless of the presence of precursor of the corresponding catalyst, different from the impregnation method, the catalyst substance may be selected freely. In addition, the amount of catalyst to be put into various multilayer configurations may be accurately adjusted, and the amount of put catalyst may also be greatly reduced.

Functions of various catalysts may be selected and utilized as desired. For example, Pd capable of prohibiting carbon impregnation is expected to give great effects in the co-electrolysis and the operation of SOFC using a hydrocarbon fuel other than hydrogen.

What is claimed is:
1. A method of forming an interlayer for a thin electrolyte solid oxide cell, comprising:
(A1) forming a first heterogeneous catalyst layer on a fuel electrode, forming a first nanostructure fuel electrode functional layer, and then ① (A2) forming a second heterogeneous catalyst layer on the first nanostructure fuel electrode functional layer and then forming a second nanostructure fuel electrode functional layer, wherein the first and the second heterogeneous catalyst layers have a thickness of 5 to 20 nm, respectively.

2. The method of forming an interlayer for a thin electrolyte solid oxide cell according to claim 1, after the step (A2), further comprising any one of processes ② to ⑤ below:

② (A3) forming a third heterogeneous catalyst layer on the second nanostructure fuel electrode functional layer and then forming a third nanostructure fuel electrode functional layer, wherein the third heterogeneous catalyst layer has a thickness of 5 to 20 nm;

③ (A3) forming a third heterogeneous catalyst layer on the second nanostructure fuel electrode functional layer and then forming a third nanostructure fuel electrode functional layer, (A4) forming a fourth heterogeneous catalyst layer on the third nanostructure fuel electrode functional layer and then forming a fourth nanostructure fuel electrode functional layer, wherein the third and the fourth heterogeneous catalyst layers have a thickness of 5 to 20 nm, respectively;

④ (A3) forming a third heterogeneous catalyst layer on the second nanostructure fuel electrode functional layer and then forming a third nanostructure fuel electrode functional layer, (A4) forming a fourth heterogeneous catalyst layer on the third nanostructure fuel electrode functional layer and then forming a fourth nanostructure fuel electrode functional layer, (A5) forming a fifth heterogeneous catalyst layer on the fourth nanostructure fuel electrode functional layer and then forming a fifth nanostructure fuel electrode functional layer, wherein the third, the fourth, and the fifth heterogeneous catalyst layers have a thickness of 5 to 20 nm, respectively; and ⑤ (A3) forming a third heterogeneous catalyst layer on the second nanostructure fuel electrode functional layer and then forming a third nanostructure fuel electrode functional layer, (A4) forming a fourth heterogeneous catalyst layer on the third nanostructure fuel electrode functional layer and then forming a fourth nanostructure fuel electrode functional layer, (A5) forming a fifth heterogeneous catalyst layer on the fourth nanostructure fuel electrode functional layer and then forming a fifth nanostructure fuel electrode functional layer, (A6) forming a sixth heterogeneous catalyst layer on the fifth nanostructure fuel electrode functional layer and then forming a sixth nanostructure fuel electrode functional layer, wherein the third, the fourth, the fifth, and the sixth heterogeneous catalyst layers have a thickness of 5 to 20 nm, respectively.

3. A method of forming an interlayer for a thin electrolyte solid oxide cell, comprising:

(B1) forming a nanostructure fuel electrode functional layer, which forms an interface with a fuel electrode, on the fuel electrode, forming a first heterogeneous catalyst layer thereon, forming a first nanostructure fuel electrode functional layer, and then ① (B2) forming a second heterogeneous catalyst layer on the first nanostructure fuel electrode functional layer and then forming a second nanostructure fuel electrode functional layer, wherein the first and the second heterogeneous catalyst layers have a thickness of 5 to 20 nm, respectively.

4. The method of forming an interlayer for a thin electrolyte solid oxide cell according to claim 3, after the step (B2), further comprising any one of processes ② to ⑤ below:

(B3) forming a third heterogeneous catalyst layer on the second nanostructure electrode functional layer and then forming a third nanostructure fuel electrode functional layer, wherein the third heterogeneous catalyst layer has a thickness of 5 to 20 nm;

(B3) forming a third heterogeneous catalyst layer on the second nanostructure fuel electrode functional layer and then forming a third nanostructure fuel electrode functional layer, (B4) forming a fourth heterogeneous catalyst layer on the third nanostructure fuel electrode functional layer and then forming a fourth nanostructure fuel electrode functional layer, wherein the third and the fourth heterogeneous catalyst layers have a thickness of 5 to 20 nm, respectively;

(B3) forming a third heterogeneous catalyst layer on the second nanostructure fuel electrode functional layer and then forming a third nanostructure fuel electrode functional layer, (B4) forming a fourth heterogeneous catalyst layer on the third nanostructure fuel electrode functional layer and then forming a fourth nanostructure fuel electrode functional layer, (B5) forming a fifth heterogeneous catalyst layer on the fourth nanostructure fuel electrode functional layer and then forming a fifth nanostructure fuel electrode functional layer; and (B3) forming a third heterogeneous catalyst layer on the second nanostructure fuel electrode functional layer and then forming a third nanostructure fuel electrode functional layer, (B4) forming a fourth heterogeneous catalyst layer on the third nanostructure fuel electrode functional layer and then forming a fourth nanostructure fuel electrode functional layer, (B5) forming a fifth heterogeneous catalyst layer on the fourth nanostructure fuel electrode functional layer and then forming a fifth nanostructure fuel electrode functional layer, (B6) forming a sixth heterogeneous catalyst layer on the fifth nanostructure fuel electrode functional layer and then forming a sixth nanostructure fuel electrode functional layer, wherein the third, the fourth, the fifth, and sixth heterogeneous catalyst layers have a thickness of 5 to 20 nm, respectively.

5. The method of forming an interlayer for a thin electrolyte solid oxide cell according to claim 1, wherein the heterogeneous catalyst layer is formed by means of sputtering, and the nanostructure fuel electrode functional layer is formed by means of pulsed laser deposition (PLD).

* * * * *